US008685169B2

(12) United States Patent
Hyakutake et al.

(10) Patent No.: US 8,685,169 B2
(45) Date of Patent: Apr. 1, 2014

(54) SUBSTRATE PROCESSING APPARATUS, SUBSTRATE PROCESSING METHOD AND STORAGE MEDIUM

(75) Inventors: Hironobu Hyakutake, Koshi (JP); Toshihide Takashima, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 225 days.

(21) Appl. No.: 12/952,804

(22) Filed: Nov. 23, 2010

(65) Prior Publication Data

US 2011/0126860 A1 Jun. 2, 2011

(30) Foreign Application Priority Data

Nov. 30, 2009 (JP) ................................. 2009-271919

(51) Int. Cl.
*C23G 1/02* (2006.01)
*B08B 3/04* (2006.01)

(52) U.S. Cl.
USPC ................ 134/19; 134/3; 134/56 R; 134/105; 134/108

(58) Field of Classification Search
None
See application file for complete search history.

(56) References Cited

U.S. PATENT DOCUMENTS 5,570,154 A * 10/1996 Kurimoto et al. ............. 396/568
5,845,660 A * 12/1998 Shindo et al. ............... 134/56 R
6,109,278 A * 8/2000 Shindo et al. ............... 134/56 R
6,277,204 B1 * 8/2001 Chang et al. ..................... 134/2
2005/0183755 A1 * 8/2005 Fujishima ................... 134/56 R

FOREIGN PATENT DOCUMENTS

| JP | 06-252121 A | 9/1994 |
| JP | 9-8034 A | 1/1997 |
| JP | 2000-164550 A | 6/2000 |
| JP | 2008-053484 A | 3/2008 |
| JP | 2009-260171 A | 11/2009 |

OTHER PUBLICATIONS

Perry's Chemical Engineer Handbook. pp. 8-71 through 8-78.*

* cited by examiner

*Primary Examiner* — Nicole Blan
(74) *Attorney, Agent, or Firm* — Abelman, Frayne & Schwab

(57) ABSTRACT

Disclosed are a substrate processing apparatus, a substrate processing method and a storage medium, capable of removing contaminant materials from a substrate by using SPM liquid (sulfuric acid and hydrogen peroxide mixture) while preventing degradation of the function of the SPM liquid for removing the contaminant materials. The SPM liquid is filled in a processing bath and the substrate is immersed in the SPM liquid. A heating unit is provided in the circulation path to heat the SPM liquid. A hydrogen peroxide supply line supplements hydrogen peroxide to the SPM liquid in the circulation path. A control unit adjusts the temperature of the SPM liquid to the predetermined temperature in the range of 135° C. to 170° C. based on a temperature detection value and outputs a control signal to supplement the sulfuric acid to compensate for the SPM liquid as the SPM liquid is evaporated by heating.

13 Claims, 8 Drawing Sheets

(a)

(b)

(a)

(b)

SUBSTRATE PROCESSING APPARATUS, SUBSTRATE PROCESSING METHOD AND STORAGE MEDIUM

This application is based on and claims priority from Japanese Patent Application No. 2009-271919, filed on Nov. 30, 2009 with the Japanese Patent Office, the disclosure of which is incorporated herein in its entirety by reference.

TECHNICAL FIELD

The present disclosure relates to a technology for processing a substrate to be processed by using SPM (Sulfuric acid-hydrogen Peroxide Mixture) liquid.

BACKGROUND

Various contaminants may be attached onto the surface of a substrate to be processed, such as a semiconductor wafer (hereinafter, referred to as "wafer"), during the semiconductor manufacturing process using a semiconductor manufacturing apparatus. In order to remove the contaminants, a cleaning process is performed with respect to the surface of the wafer by using various chemical liquids.

The SPM liquid is a mixture of sulfuric acid and hydrogen peroxide, and used to remove the delaminated photoresist or other organic contaminant materials from the surface of the wafer. For instance, the SPM liquid is used for a single type wafer processing apparatus, which cleans a wafer by supplying a chemical liquid onto the surface of the wafer which rotates on a turntable, or a batch type wafer processing apparatus, which simultaneously cleans a plurality of wafers by immersing the wafers in a processing bath filled with the chemical liquid.

In the batch type wafer processing apparatus, tens of wafers are immersed in the processing bath filled with the SPM liquid heated at the temperature of about 100° C. to 130° C., and the wafers are taken out of the processing bath after a predetermined time has elapsed. Then, next tens of wafers are immersed in the processing bath, so the wafers can be continuously processed. As the wafers are being continuously processed, the SPM liquid filled in the processing bath may stick onto the surface of the wafers and some SPM liquid may be discharged out of the processing bath, so that the liquid level of the SPM liquid may be lowered. Thus, the sulfuric acid or the hydrogen peroxide is periodically supplemented to the SPM liquid.

However, since the hydrogen peroxide is a relatively unstable material and gradually decomposed to create water, the concentration of the sulfuric acid in the SPM liquid is slightly lowered even if the sulfuric acid or the hydrogen peroxide is supplemented to compensate for the lowered level of the SPM liquid. If the concentration of the sulfuric acid is lowered, the function for removing the contaminant material is degraded, so that the wafer processing in the processing bath may be periodically stopped to exchange the SPM liquid with a new SPM liquid. For this reason, the wafer processing efficiency may be lowered and consumption of the SPM liquid may be increased, so that the cost for the chemical liquids may rise.

Regarding the supplement of the sulfuric acid or the hydrogen peroxide into the SPM liquid, for example, Japanese Unexamined Patent Publication No. 2000-164550 (paragraphs 0021, 0031-0033 and 0071, and FIG. 3) discloses a technology in which a concentration detection unit is provided in a processing bath to detect the concentration of the sulfuric acid in the processing bath to supplement the sulfuric acid such that the concentration of the sulfuric acid in the SPM liquid may not be lowered below the predetermined level. According to the technology disclosed in Japanese Unexamined Patent Publication No. 2000-164550, a greater amount of sulfuric acid may be supplemented in order to compensate for the lowered concentration of the sulfuric acid caused by the decomposition of the hydrogen peroxide, and the frequency of the exchange for the SPM liquid due to the lowered concentration of the sulfuric acid is reduced, so that the total amount of use for the sulfuric acid can be reduced.

In addition, Japanese Unexamined Patent Publication No. 9-8034 (paragraph, 0008) discloses a technology in which the SPM liquid (referred to as sulfuric acid hydrogen peroxide) is heated at the temperature of about 120□□140□ to remove a resist layer from the surface of a wafer. However, the technology disclosed in Japanese Unexamined Patent Publication No. 9-8034 fails to disclose the solution for solving the problems derived from the lowering of the concentration of the sulfuric acid and the exchange of the entire SPM liquid caused by the lowering of the concentration of the sulfuric acid.

The technologies disclosed in the above patent documents require the detection unit for detecting the concentration of the sulfuric acid, so the cost for the apparatus may rise. In addition, since the level of the chemical liquids in the processing bath cannot be controlled by the supplement of the chemical liquids to control the concentration of the sulfuric acid, there is a case that supplements an excessive amount of the sulfuric acid beyond the critical level of the concentration to maintain the level of the SPM liquid in the processing bath even if the concentration of the sulfuric acid is sufficient, so the consumption of the sulfuric acid may not be sufficiently reduced.

SUMMARY

A substrate processing apparatus according to the disclosure comprises a processing bath to process a substrate by immersing the substrate in SPM liquid (sulfuric acid and hydrogen peroxide mixture), a circulation path to circulate the SPM liquid in the processing bath, a heating unit provided in the circulation path to heat the SPM liquid, a sulfuric acid supply unit to supplement sulfuric acid to the SPM liquid, a hydrogen peroxide supply unit provided at a downstream side of the heating unit in the circulation path in front of an outlet of the circulation path to supplement hydrogen peroxide to the SPM liquid, and a temperature detection unit to detect a temperature of the SPM liquid in the processing bath. The substrate processing apparatus further comprises a control unit that outputs a control signal to adjust an output of the heating unit based on a temperature detection value of the temperature detection unit to allow a temperature of the SPM liquid in the processing bath to be maintained in a predetermined range of 135° C. to 170° C., and to supplement the sulfuric acid from the sulfuric acid supplement unit to compensate for the SPM liquid as the SPM liquid is evaporated by heating.

The forgoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
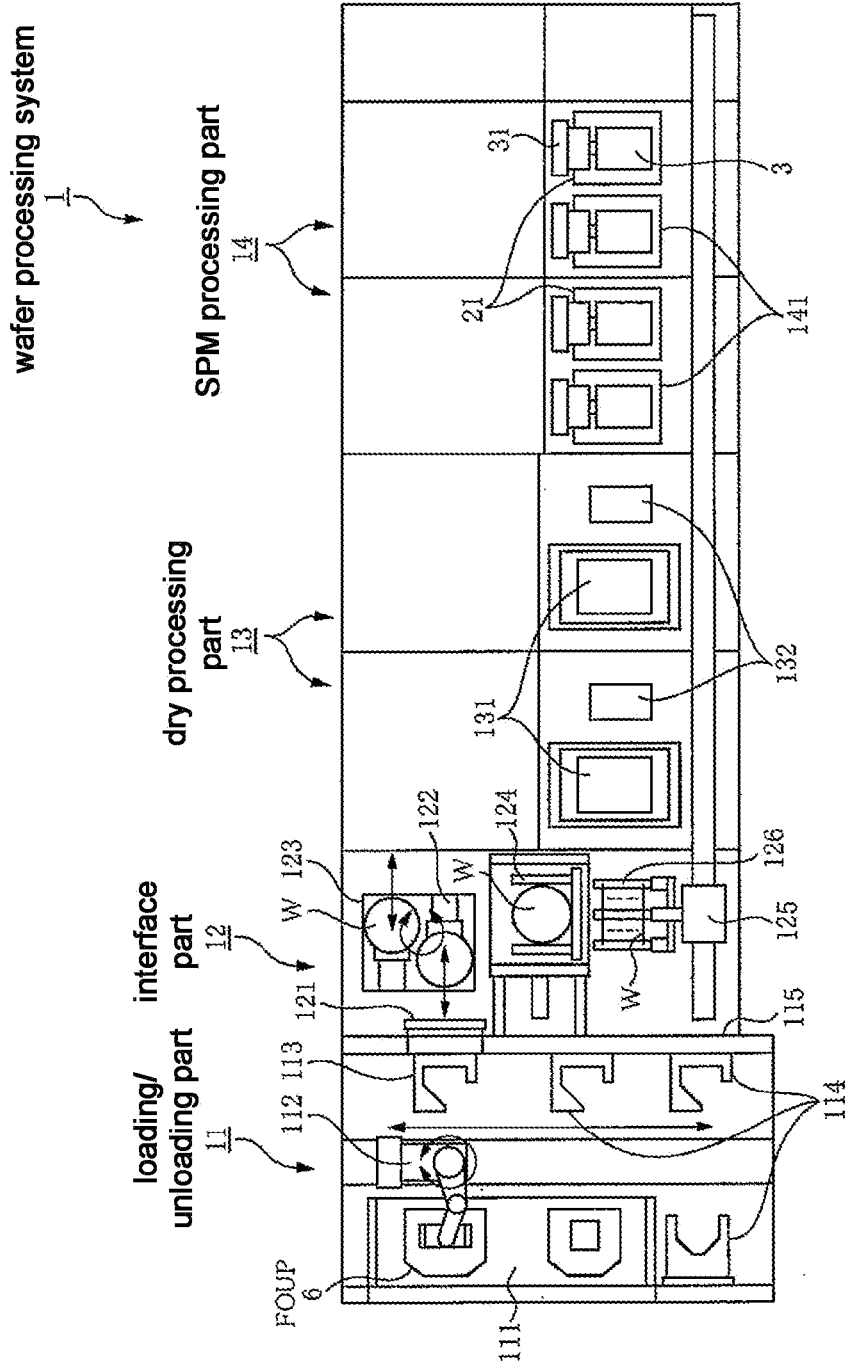
FIG. 1 is a plan view illustrating a wafer processing apparatus having a processing apparatus according to the embodiment of the present disclosure.

In the following detailed description, reference is made to the accompanying drawings, which form a part hereof. The illustrative embodiments described in the detailed description, drawings, and claims are not meant to be limiting. Other embodiments may be utilized and other changes may be made, without departing from the scope of the subject matter presented here.

The disclosure provides a substrate processing apparatus, a substrate processing method and a storage medium, capable of removing contaminant materials from a substrate by using SPM liquid (sulfuric acid and hydrogen peroxide mixture) while preventing degradation of the function of the SPM liquid for removing the contaminant materials.

According to an embodiment of the present disclosure, there is provided a substrate processing apparatus which includes a processing bath to process a substrate by immersing the substrate in SPM liquid (sulfuric acid and hydrogen peroxide mixture), a circulation path to circulate the SPM liquid in the processing bath, a heating unit provided in the circulation path to heat the SPM liquid, a sulfuric acid supply unit to supplement sulfuric acid to the SPM liquid, a hydrogen peroxide supply unit provided at a downstream side of the heating unit in the circulation path in front of an outlet of the circulation path to supplement hydrogen peroxide to the SPM liquid, and a temperature detection unit to detect a temperature of the SPM liquid in the processing bath. The substrate processing apparatus of the present disclosure further includes a control unit that outputs a control signal to adjust an output of the heating unit based on a temperature detection value of the temperature detection unit to allow a temperature of the SPM liquid in the processing bath to be maintained in a predetermined range of 135° C. to 170° C., and to supplement the sulfuric acid from the sulfuric acid supplement unit to compensate for the SPM liquid as the SPM liquid is evaporated by heating.

The substrate processing apparatus may include the following features. (a) A flow rate of the SPM liquid in the circulation path may be in the range of 20 l/min to 50 l/min (b). The substrate may be processed by repeatedly immersing a new substrate in the SPM liquid of the processing bath and taking the substrate out of the processing bath, and the control unit may control the sulfuric acid supplement unit to periodically supplement the sulfuric acid after the processed substrate has been taken out of the processing bath and before a next substrate is immersed in the SPM liquid. (c) The substrate processing apparatus may further include an outer tub provided at an upstream side of the circulation path to receive the SPM liquid overflowing from the processing bath, and a liquid level detection unit to detect a liquid level of the SPM liquid in the outer tub, and the control unit may control the sulfuric acid supplement unit to supplement the sulfuric acid into the SPM liquid when the liquid level of the SPM liquid detected by the liquid level detection unit is lower than a predetermined level. (d) A supplement position of the hydrogen peroxide in the circulation path may be preset in such a manner that the SPM liquid is able to be introduced from the supplement position into the processing bath within 5 seconds. (e) The supplement position of the hydrogen peroxide in the circulation path is preset within 50 cm from the outlet of the circulation path in the upstream direction.

According to another embodiment of the present disclosure, there is provided a method of processing a substrate comprising processing a substrate by immersing the substrate in SPM liquid (sulfuric acid and hydrogen peroxide mixture) filled in a processing bath, circulating the SPM liquid in the processing bath through a circulation path, adjusting a temperature of the SPM liquid filled in the processing bath to a predetermined temperature in a range of 135° C. to 170° C. by heating the SPM liquid in the circulation path, supplementing sulfuric acid to the SPM liquid to compensate for the SPM liquid as the SPM liquid is evaporated by heating, and supplementing hydrogen peroxide to the SPM liquid at a downstream side of a heating position for the SPM liquid in the circulation path in front of an outlet of the circulation path.

The substrate processing method may include the following features. (a) A flow rate of the SPM liquid in the circulation path is in a range of 20 l/min to 50 l/min. (b) Immersing a substrate in the SPM liquid of the processing bath and taking the substrate out of the processing bath are repeatedly performed, and the sulfuric acid is periodically supplemented after a processed substrate has been taken out of the processing bath and before a next substrate is immersed in the SPM liquid. (c) The method may further comprising receiving the SPM liquid overflowing from the processing bath using an outer tub and allowing the SPM liquid to flow through the circulation path, and detecting a liquid level of the SPM liquid in the outer tub. In particular, the sulfuric acid is supplemented into the SPM liquid when the detected liquid level of the SPM liquid is lower than a predetermined level. (d) The supplement position of the hydrogen peroxide in the circulation path is preset in such a manner that the SPM liquid is able to be introduced from the supplement position into the processing bath within 5 seconds. (e) The supplement position of the hydrogen peroxide in the circulation path is preset within 50 cm from the outlet of the circulation path in an upstream direction.

According to yet another embodiment of the present disclosure, there is provided a storage medium having a computer program used in a substrate processing apparatus for processing a substrate by immersing the substrate in SPM liquid (sulfuric acid and hydrogen peroxide mixture), wherein the computer program comprises commands for executing the method for processing the substrate as described above.

According to the present disclosure, the temperature of the SPM is adjusted in the range of 135° C. to 170° C., which is higher than the normal temperature range, so that moisture components of the mixture of the sulfuric acid, the hydrogen peroxide, and water constituting the SPM can be preferentially evaporated. As a result, water is extracted from the SPM, so that the lowering of the concentration of the sulfuric acid caused by water created from the hydrogen peroxide can be restrained, thereby reducing the frequency of the exchange for the SPM.

In addition, according to the present disclosure, 1) the hydrogen peroxide supply unit is provided at the downstream side of the heating unit installed in the circulation path, 2) the supply position of the hydrogen peroxide is located in front of the outlet of the circulation path. Therefore, even when the temperature of the SPM liquid is raised higher than the normal temperature of the SPM liquid in order to preferentially evaporate the moisture component, the decomposition of the component, such as the hydrogen peroxide and Caro's acid derived from the reaction between the sulfuric acid and the hydrogen peroxide, effective for removing the contaminant materials can be restrained.

Figure 2:
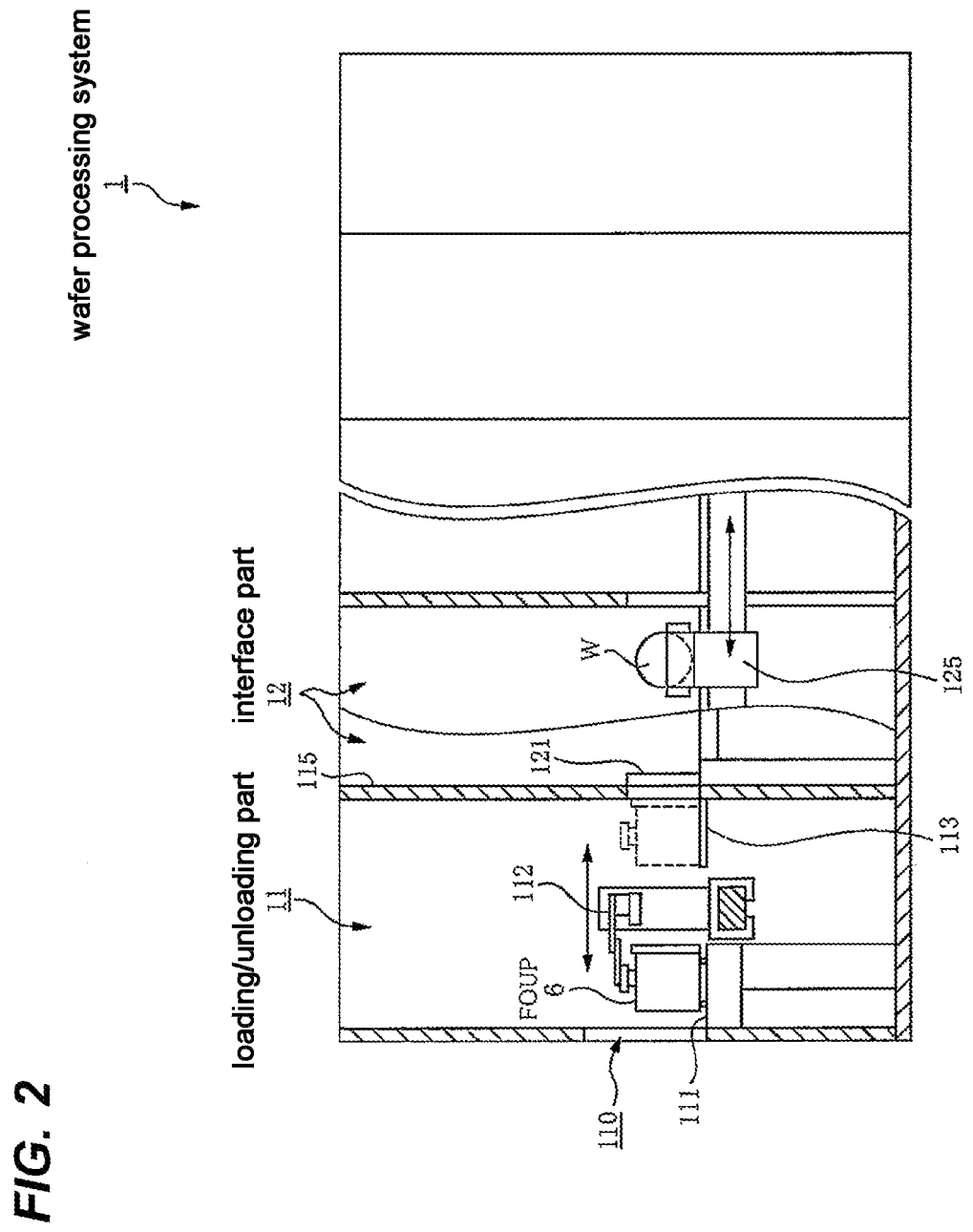
FIG. 2 is a partially-sectional side view of the wafer processing apparatus.
Figure 3:
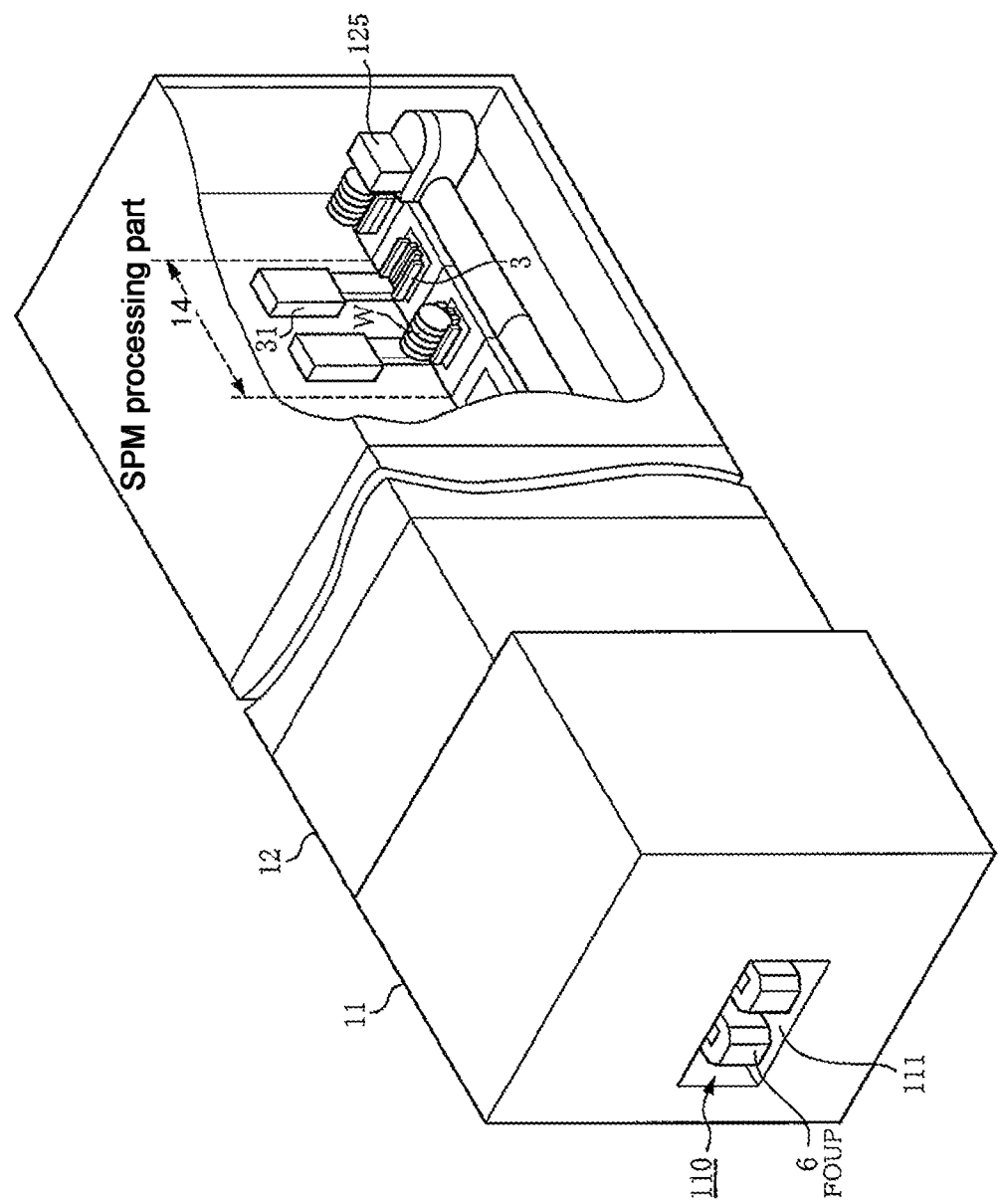
FIG. 3 is a partially-sectional perspective view of the wafer processing apparatus.

Hereinafter, a wafer processing system 1 having SPM processing apparatus 2, which is the substrate processing apparatus of the present disclosure, will be described with reference to FIGS. 1 to 3. In the following description, the left side of the drawings will be regarded as the front side. Wafer processing system 1 includes a loading/unloading part 11 for loading/unloading a FOUP (front opening unified pod) 6, an interface part 12 for adjusting the position of wafer W or changing the posture of wafer W to carry wafer W between FOUP 6 loaded into loading/unloading part 11 and each processing part 13 and 14 provided at the rear end of FOUP 6, a pair of dry processing parts 13 for drying wafer W after the liquid processing for wafer W has been completed, and a pair of SPM processing parts 14 for processing wafer W using the SPM liquid. The above elements are sequentially arranged from the front side of wafer processing system 1.

Loading/unloading part 11 includes a placement table 111 for placing FOUP 6 from an external transfer device, a first carrier arm 112 for carrying FOUP 6 inside loading/unloading part 11, a transfer table 113 for arranging FOUP 6 where wafers W are being loaded/unloaded, and three storage shelves 114 for temporarily storing FOUP 6 after wafers W have been taken out.

For instance, two FOUPs 6 may be placed on placement table 111. As shown in FIG. 3, FOUPs 6 can be loaded/unloaded from the external transfer device through a loading/unloading port 110 formed at the front side of wafer processing system 1. When viewed from the front direction, first carrier arm 112 is provided to be rotatable and movable in the left and right directions to load/unload FOUPs 6 between placement table 111 and transfer table 113, and between alignment table 111 and each of storage shelves 114. As shown in FIG. 2, transfer table 113 is fixed to a partition wall 115 interposed between loading/unloading part 11 and interface part 12, and a door 121 is installed in partition wall 115 to attach/detach a cover provided at a lateral side of FOUP 6.

Interface part 12 is equipped with a transfer arm 122 for transferring wafer W to/from FOUP 6 arranged on transfer table 113, a posture changing device 124 for changing the posture of wafer W, and a second carrier arm 125 for carrying wafer W between interface part 12 and each processing part 13 and 14 provided at the rear end of interface part 12. Although not shown in the drawings, interface part 12 is also provided with a notch aligner to align the notch of wafer W before wafer W is transferred from transfer arm 122 to posture changing device 124.

Transfer arm 122 is provided to be movable forward and backward directions and, for example, two transfer arms 122 may be installed on a rotatable arm table 123 to longitudinally align a plurality of wafers W in a horizontal state. Posture changing device 124 changes the posture of wafer W from the horizontal state to the vertical state or vice versa. In other words, posture changing device 124 grasps both ends of wafers W to longitudinally align wafers W in the horizontal state (horizontal posture) and rotates wafers W at an angle of 90° such that wafers W are aligned in the vertical state (vertical posture). As shown in FIGS. 1 and 2, second carrier arm 125 may hold fifty wafers W aligned in the vertical state by using, for example, three wafer supports 126, and freely moves forward and backward directions between interface part 12 and each processing part 13 and 14.

A pair of dry processing parts 13, for example, are aligned in the forward and backward directions, and each dry processing part 13 includes a wafer support cleaning unit 132 for cleaning wafer supports 126 of second carrier arm 125, and a wafer drying unit 131 for drying cleaned wafer W and wafer supports 126.

Similar to dry processing parts 14, a pair of SPM processing parts 14 are aligned in the forward and backward directions. Each SPM processing part 14 includes SPM processing bath 21 filled with SPM liquid to remove resist from the surface of wafer W, a rinse bath 141 filled with deionized water (DIW) to rinse wafer W processed by the SPM liquid, a wafer boat 3 provided in each bath 21 and 141 to transfer wafer W to/from second carrier arm 125, and an elevating unit 31 for elevating wafer boat 3. SPM processing bath 2, wafer boat 3, and elevating unit 31 constitute a part of SPM processing apparatus 2 which is the substrate processing apparatus according to the present embodiment, and details thereof will be described hereinafter.

In wafer processing system 1 having the above structure, SPM processing apparatus 2 provided in SPM processing part 14 is configured to restrain the lowering of the concentration of sulfuric acid in the SPM liquid, so the ability for removing contaminant materials, such as resist, may not be degraded. Hereinafter, the structure of SPM processing apparatus 2 will be described in detail with reference to FIGS. 4 and 5.

Figure 4:
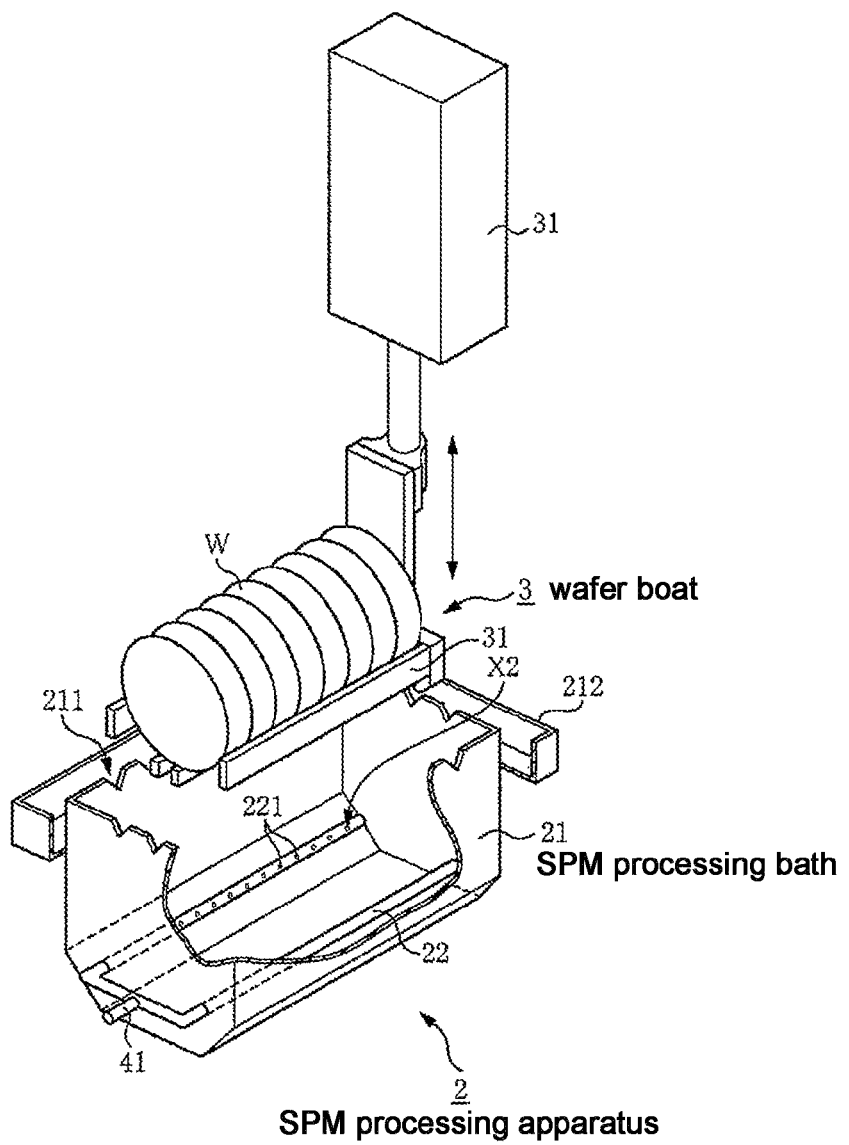
FIG. 4 is a perspective view showing a processing bath and a wafer boat installed in the processing apparatus.

Referring to FIG. 4, for example, wafer boat 3 is constructed in such a way that four wafer supports 32 having bar shapes and extending perpendicularly to the movement direction of second carrier arm 125 (forward and backward directions) are connected to a common elevating unit 31. By longitudinally crossing wafer supports 32 of wafer boat 3 and wafer supports 126 of second carrier arm 125, for example, fifty wafers W may be aligned in the vertical state. Elevating unit 31 elevates wafer boat 3 between a wafer transfer position for transferring wafer W to/from second carrier arm 125 and a wafer processing position for immersing wafer W into the SPM liquid filled in SPM processing bath 21.

SPM processing bath 21 processes wafer W using the SPM liquid. For instance, both sides of the bottom of SPM processing bath 21 are inclined inward, and the top surface of SPM processing bath 21 is opened. When viewed in a plan view, SPM processing bath 21 has a rectangular shape. For instance, SPM processing bath 21 is a container made from quartz or polypropylene. A notch part 211 having an inverted triangular shape is formed at the upper peripheral portion of SPM processing bath 21 to allow the SPM liquid to overflow from SPM processing bath 21. In addition, an outer tub 212 is provided outside the upper peripheral portion of SPM processing bath 21 to receive the SPM liquid overflowing through notch part 211. For the purpose of convenience, outer tub 212 is partially shown in FIG. 4 even though outer tub 212 surrounds the upper peripheral portions of the four lateral sides of SPM processing bath 21.

For example, two SPM supply nozzles 22 are provided on the bottom of SPM processing bath 21 to supply the SPM liquid into SPM processing bath 21. SPM supply nozzles 22 are aligned in parallel to each other along the long lateral side of SPM processing bath 21. A plurality of discharge holes 221 are formed and opened in each SPM supply nozzle 22. For instance, the SPM liquid is slantingly discharged through discharge holes 221 toward wafer W immersed in SPM processing bath 21. Discharge holes 221 may serve as an outlet of the circulation path of the present embodiment, which will be described later in detail.

Figure 5:
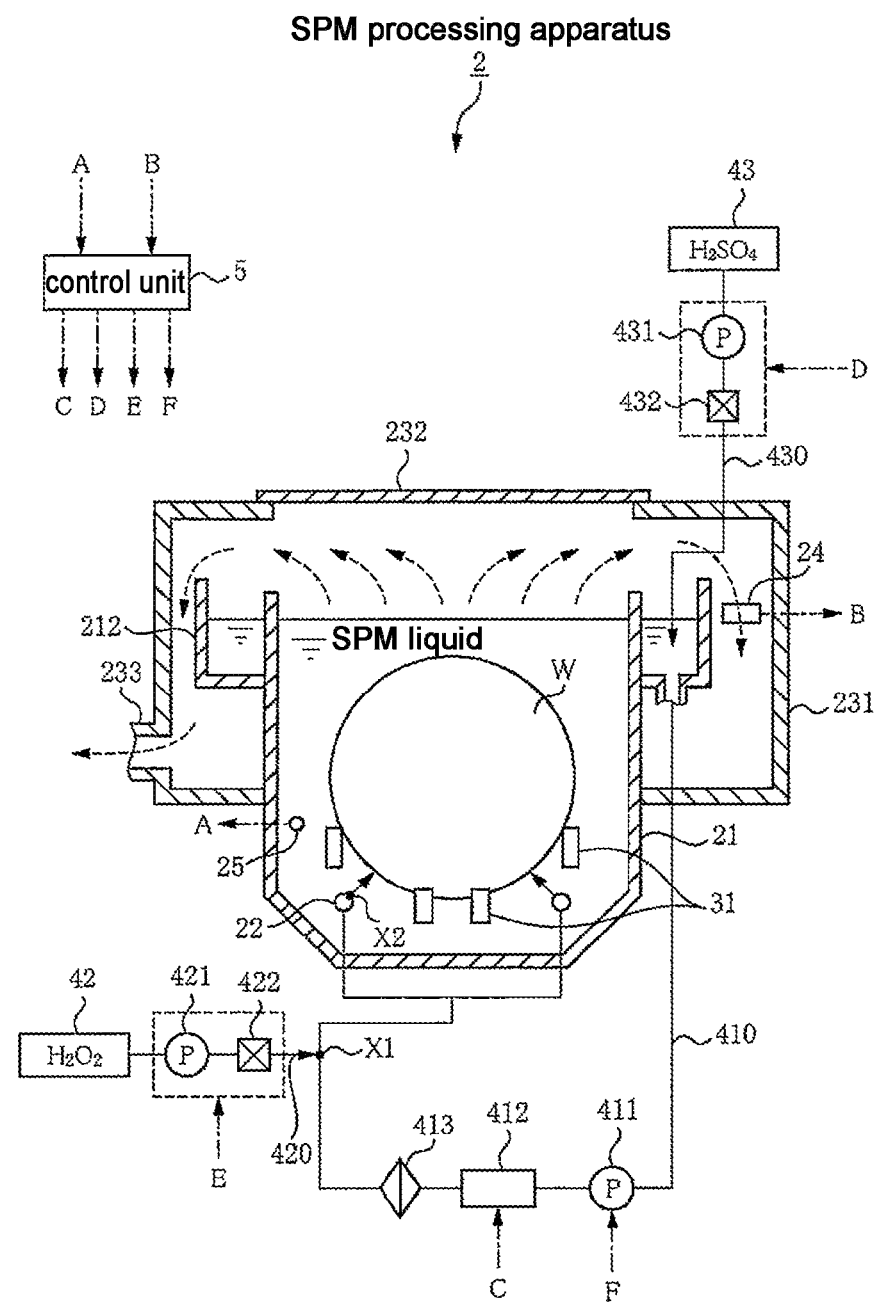
FIG. 5 is a longitudinally-sectional side view of the processing apparatus.

As shown in FIG. 5, for example, a circulation line 410 is provided on the bottom of outer tub 212 and connected to SPM supply nozzles 22. Thus, the SPM liquid overflowing into outer tub 212 through the upper peripheral portion of SPM processing bath 21 is re-provided into SPM processing bath 21 by way of circulation line 410 and SPM supply nozzles 22. In this regard, circulation line 410 and SPM supply nozzles 22 may constitute the circulation path of the present embodiment. A circulation pump 411 for circulating the SPM liquid, a heating unit 412 for heating the SPM liquid at a predetermined temperature, and a filter 413 for filtering solidified impurities from the SPM liquid are installed in circulation line 410.

For instance, heating unit 412 may include a heating element wound around circulation line 410. Heating unit 412 heats the SPM liquid that circulates through circulation line 410 while adjusting the power supplied from a power supply unit (not shown) based on the temperature value of the SPM liquid detected by a temperature detection unit 25 which includes a thermocouple provided in SPM liquid processing bath 21, thereby controlling the temperature in SPM processing bath 21. The position of temperature detection unit 25 is not limited in SPM processing bath 21. For example, temperature detection unit 25 can be installed in outer tub 212 or circulation line 410 in front of heating unit 412 as long as temperature detection unit 25 can practically detect the temperature of the SPM liquid in SPM processing bath 21.

A hydrogen peroxide tank 42 is connected to circulation line 410 through a hydrogen peroxide supply line 420 at the downstream side of heating unit 412 to supplement hydrogen peroxide to the SPM liquid that circulates through circulation line 410. Since the hydrogen peroxide is supplemented to the downstream side of heating unit 412, the hydrogen peroxide and Caro's acid, which are thermally unstable, can be prevented from being directly heated by heating unit 412 so that decomposition of the hydrogen peroxide and the Caro's acid can be restrained. Reference numerals 422 and 421 represent an opening/closing valve and a hydrogen peroxide supply pump, respectively. Hydrogen peroxide tank 42, hydrogen peroxide supply line 420, and hydrogen peroxide supply pump 421 constitute a hydrogen peroxide supply part of the present embodiment.

Meanwhile, a sulfuric acid tank 43 is connected to outer tub 212 through a sulfuric acid supply line 430 to supplement the sulfuric acid to the SPM liquid. Similar to SPM processing bath 21, sulfuric acid supply line 430 is made from transparent material, such as quartz or polypropylene. For instance, a liquid level detector of the disclosure, that is, an infrared laser type liquid level sensor 24 installed at the side of outer tub 12 can optically detect whether the liquid level of outer tub 212 is higher than a predetermined liquid level. If the liquid level detected by liquid level sensor 24 is lower than the predetermined liquid level, the sulfuric acid is supplemented from sulfuric acid tank 43 to outer tub 212 in such a manner that a predetermined amount of the SPM liquid can be maintained in SPM processing bath 21, outer tub 212 and circulation line 410. Reference numerals 432 and 431 represent an opening/closing valve and a sulfuric acid supply pump installed in sulfuric acid supply line 430, respectively. Sulfuric acid tank 43, sulfuric acid supply line 430, and sulfuric acid supply pump 431 constitute a sulfuric acid supply part of the present embodiment.

In addition, a hood unit 231 is installed at SPM processing bath 21 to cover an upper portion of SPM processing bath 21 and outer tub 212. Vapor (indicated as arrows with dotted-line in FIG. 5) generated from SPM processing bath 21 and outer tub 212 is exhausted to the outside through an exhaust path 233 connected to a blower and formed at a sidewall of a lower portion of hood 231. A cover unit 232 configured to be opened and closed is provided at the top surface of hood 231. Cover unit 232 is opened when wafer boat 3 is elevated, so that wafer unit 232 can be unloaded without interfering with hood 231. The space formed inside hood 231 and connected to exhaust path 233 may correspond to an exhaust part of the present embodiment. Cover unit 232 provided on hood 231 may be omitted.

As shown in FIG. 5, SPM processing apparatus 2 having the above structure is connected to a control unit 5. Control unit 5 includes, for example, a computer having a CPU (not shown) and a memory (not shown). The memory stores a program for operating each device of wafer processing system 1 including steps (commands) related to the operations, such as loading of FOUP 6 into loading/unloading part 11, unloading and processing of wafer W, loading of wafer W onto FOUP 6, and unloading of FOUP 6. The program may be stored in a storage medium, such as a hard disc, a compact disc, a magneto-optical disc, or a memory card, and installed in the computer by using the storage medium.

In addition, a program for processing wafer W using the SPM liquid in SPM processing apparatus 2 is also stored in the memory of control unit 5. Further, various operations for adjusting the supplement of the hydrogen peroxide and sulfuric acid from hydrogen peroxide tank 42 and sulfuric acid tank 43, respectively, initiating and stopping the circulation of the SPM liquid in circulation line 410, and adjusting the temperature of the SPM liquid by using heating unit 412 can be executed under the control of control unit 5.

In order to prevent the concentration of the sulfuric acid from being lowered in the SPM liquid, SPM processing apparatus 2 according to the present embodiment adjusts the temperature of the SPM liquid in the range of 135° C. to 170° C., which is higher than the normal temperature range of 100° C. to 130° C. According to the embodiment, SPM processing apparatus 2 adjusts the temperature of the SPM liquid in the range of 140° C. to 150° C., for instance, 140° C. The SPM liquid mainly consists of the sulfuric acid, hydrogen peroxide, and water, and can be obtained by mixing 1 volume of high-concentration sulfuric acid with 0.05 to 1 volume of hydrogen peroxide. Vapor pressure of the components may rise in the order of sulfuric acid<hydrogen peroxide<water.

Thus, the moisture components can be preferentially evaporated from the surface of the SPM liquid by raising the temperature of the SPM liquid to be higher than the normal temperature. As a result, the lowering of the concentration of the sulfuric acid can be restrained by extracting the water, which is created due to the decomposition of the hydrogen peroxide, from the SPM liquid and supplementing the sulfuric acid to compensate for the evaporated moisture components. If the temperature of the SPM liquid is lower than 135° C., the moisture may not be efficiently evaporated. In contrast, if the temperature of the SPM liquid is higher than 170° C., the hydrogen peroxide may be excessively decomposed.

Meanwhile, when the resist is removed by using the SPM liquid, the components of the hydrogen peroxide and the sulfuric acid may react with the contaminant materials, and the Caro's acid ($H_2SO_5$) derived from the reaction between the hydrogen peroxide and the sulfuric acid may exert influence upon the removal of the contaminant materials. In addition, if these components are supplied onto the surface of wafer W with higher temperature, the ability for removing the contaminant materials can be improved and the mixing ratio of the hydrogen peroxide to the high-density sulfuric acid can be controlled. As a result, the lowering of the concentration of the sulfuric acid (that is, the increase of moisture concentration) caused by the decomposition of the hydrogen peroxide can be further restrained. However, since the Caro's acid and the hydrogen peroxide are thermally unstable, the Caro's acid and the hydrogen peroxide may be decomposed when the temperature is raised, thereby degrading the ability for removing the contaminant materials.

In this regard, as described above, SPM liquid processing apparatus 2 according to the present embodiment provides hydrogen peroxide supply line 420 connected to the downstream side of heating unit 412 to prevent the Caro's acid and the hydrogen peroxide from being directly heated by heating unit 412, thereby restraining the decomposition of the Caro's acid and the hydrogen peroxide.

In addition, according to SPM processing apparatus 2 of the present embodiment, the position for supplementing the hydrogen peroxide into circulation line 410 of the circulation path is located in front of the outlet (discharge holes 221) of SPM supply nozzle 22 of the circulation path. The expression "the position in front of the outlet of the circulation path" signifies the case (e.g., a position), for example, that enables the SPM liquid to be discharged through discharge holes 221 of SPM nozzle 22 within 5 seconds after the hydrogen peroxide is supplemented to the SPM liquid circulating in circulation line 410 under the atmosphere for processing wafer W in SPM processing bath 21. For instance, the SPM liquid can be discharged within 5 seconds in this embodiment by adjusting, for example, the supplement point (X1 of FIG. 5) of the hydrogen peroxide, the distance (for instance, 50 cm or less) between the supplement point and discharge hole 221 of SPM supply nozzle 22 farthest from the supplement point (X2 of FIGS. 4 and 5), the thickness of circulation line 410 and SPM supply nozzle 22, and the flow rate of the SPM liquid after the hydrogen peroxide is supplemented to the SPM liquid (for instance, in the range of 20 l/min to 50 l/min: if the diameter of circulation line 410 and SPM supply nozzle 22 is 20 mm, the flux is in the range of 1 m/sec to 2.7 m/sec). Thus, the ability for removing the contaminant materials may not be degraded even if the temperature of the SPM liquid is raised higher than the normal temperature. In other words, wafer W can be processed under the condition that the contaminant materials have been efficiently removed from the surface of wafer W.

Hereinafter, the operation of wafer processing system 1 having SPM processing apparatus 2 will be described. First, for example, FOUPs 6 holding twenty-five wafers W are loaded onto placement table 11 by an external carrier robot. Then, as shown in FIG. 2, first carrier arm 112 moves FOUPs 6 onto transfer table 113 opposite to door 121 of interface part 12.

Door 121 detaches the cover from FOUP 6, and transfer arm 122 of one side is introduced into FOUP 6 to take wafer W out of FOUP 6. As wafer W is taken out of FOUP 6, the cover of FOUP 6 is closed and FOUP 6 is moved onto storage shelf 114 by first carrier arm 112.

Transfer arm 122, which holds wafer W taken out of FOUP 6, transfers wafer W to the notch aligner (not shown) and then receives wafer W from the notch aligner after the notch alignment has been performed. Then, arm table 123 that supports transfer arm 122 is rotated such that transfer arm 122 that holds wafer W may face posture changing device 124. In this state, transfer arm 122 is introduced into posture changing device 124 to transfer wafer W.

Posture changing device 124 adjusts the interval between wafers W and changes the posture of wafers W, and then wafers W are transferred to second carrier arm 125 installed in interface part 12. Such operations are continuously performed until fifty wafers W are loaded. Second carrier arm 125 transfers wafers W to one of two SPM processing parts 14. Although wafers W can be alternately transferred to both SPM processing parts 14, one SPM processing part 14 processes wafers W by using the SPM liquid and the remaining SPM processing part 14 stays in the standby state in the present embodiment.

If second carrier arm 125 is moved to one SPM processing part 14 where wafers W are processed, SPM processing apparatus 2 of SPM processing part 14 moves up wafer boat 3 from a lower portion of second carrier arm 125 to the wafer transfer position, and wafer supports 126 and 31 are crossed with each other in the longitudinal direction, so that wafer W is transferred to wafer boat 3 as shown in FIG. 4. After transferring wafer W, second carrier arm 125 is retreated to the lateral direction completing the preparation of loading wafer W into SPM processing bath 21.

At this time, SPM liquid processing bath 21 is filled with the SPM liquid, and the SPM liquid circulates through the circulation system by way of SPM processing bath 21→outer tub 212→circulation line 410→SPM supply nozzle 22→SPM processing bath 21. In addition, after the sulfuric acid has been supplied until the liquid level of outer tub 212 reaches a predetermined liquid level, the temperature of the SPM liquid is adjusted to, for example, 140° C. by heating unit 412.

Figure 6:
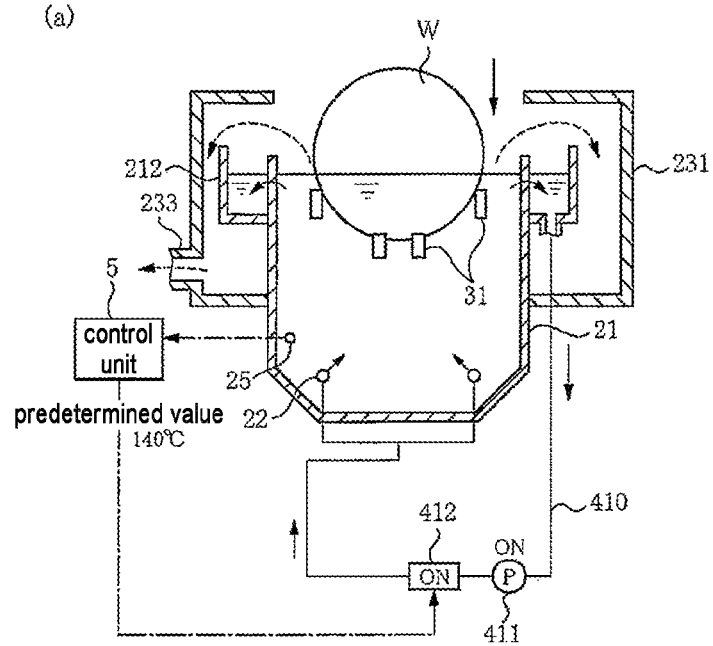
FIGS. 6a and 6b are each a view showing a first operational state of the processing apparatus.
Figure 6:
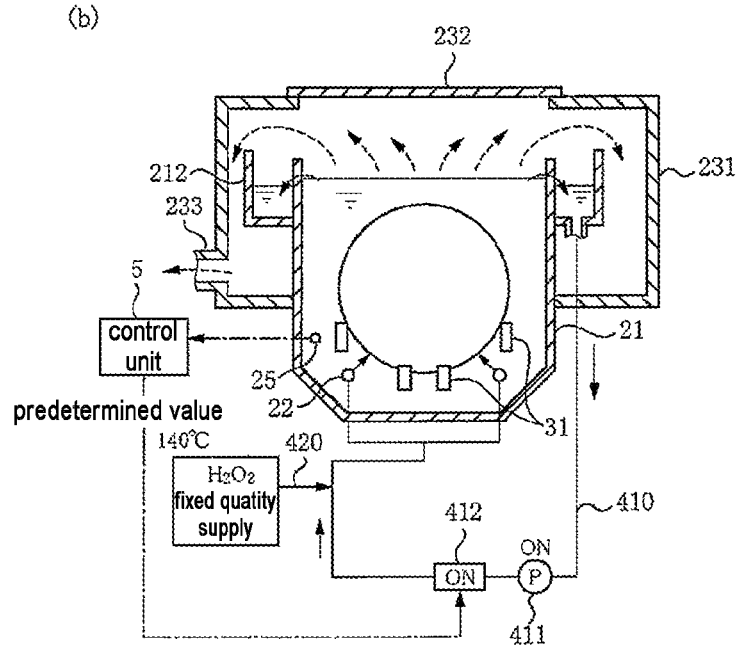

If wafer W is transferred to wafer boat 3 of SPM processing apparatus 2 adjusted as described above, cover unit 232 of hood unit 231 is opened and wafer boat 3 is moved down, so that wafer W is immersed in the SPM liquid filled in SPM processing bath 21 (see, (a) of FIG. 6). That is, as wafer boat 3 is moved down to the wafer processing position such that wafer W can be immersed in the SPM liquid, the SPM liquid discharged from SPM supply nozzle 22 flows along the surface of wafer W so that wafer W is beginning to be processed by the SPM liquid and cover unit 232 is closed. At this time, since the SPM liquid is maintained at the temperature higher than the normal temperature of 100° C.~130° C., the ability for removing the contaminant materials can be improved as compared with the low-temperature SPM liquid prepared under the same concentration ratio. In FIGS. 6(*a*) to 7(*b*), descriptions for filter 413 and supply pumps 421 and 431, etc. are appropriately omitted.

As wafer W is fully immersed in the SPM liquid, as shown in FIG. 6(*b*), the hydrogen peroxide is supplemented through hydrogen peroxide supply line 420 in order to improve the ability for removing the contaminant materials. For instance, if 55 l of the SPM liquid is filled in SPM processing bath 21 under the temperature of 100□ to 130□, the amount of the hydrogen peroxide to be supplemented is about 400 ml to 700 ml. However, since the temperature of the SPM liquid is raised in the range of 135□ to 170□, the SPM liquid can be activated so that the amount of the hydrogen peroxide to be supplemented may be reduced to about 150 ml to 300 ml. As a result, the increase of the moisture components caused by the decomposition of the hydrogen peroxide can be restrained, thereby restraining the lowering of the concentration of the sulfuric acid.

In addition, since the temperature of the hydrogen peroxide supplied from hydrogen peroxide tank 42 is lower than the temperature of the SPM liquid, the temperature of the SPM liquid that makes contact with the hydrogen peroxide while circulating in circulation line 410 is slightly lowered. Therefore, when comparing with the case in which the SPM liquid is heated after the hydrogen peroxide has been supplied from the upstream side of heating unit 412, the decomposition of the hydrogen peroxide itself and the Caro's acid generated by the supplement of the hydrogen peroxide can be effectively restrained.

In addition, according to the present embodiment, the SPM liquid, to which fresh hydrogen peroxide is supplied, can be discharged within 5 seconds under the atmosphere for processing wafer W in SPM processing bath 21 by adjusting the supply point (X1 of FIG. 5) of the hydrogen peroxide, the distance between the supply point and discharge hole 221 of SPM supply nozzle 22 farthest from the supply point (X2 of FIGS. 4 and 5), the thickness of circulation line 410 and SPM supply nozzle 22, the flow rate of the SPM liquid and the supply rate of the hydrogen peroxide (that is, the flux of the SPM liquid after the hydrogen peroxide has been supplied). Therefore, even when the temperature of the SPM liquid is raised higher than the normal temperature, components of the Caro's acid and the hydrogen peroxide may reach the surface of wafer W before the Caro's acid and the hydrogen peroxide are excessively decomposed.

As shown in FIG. 4, the SPM liquid including many effective components, such as the Caro's acid, due to the supplement of the hydrogen peroxide may be discharged through each discharge hole 221 sequentially formed along the alignment direction of wafers W. The SPM liquid is introduced into the gap between wafers W while making contact with the surfaces of wafers W, thereby beginning to remove the contaminant materials from the surfaces of wafers W.

In this manner, for instance, 150 ml to 300 ml of the hydrogen peroxide is supplemented for 0.5 to 5 seconds, and the SPM liquid is circulated through circulation line 410 in order to process wafers W in SPM processing bath 21 for 10 to 15 minutes. As a predetermined time has elapsed, cover unit 232 is opened and wafer boat 3 is moved up to unload wafer W from SPM processing bath 21 (see, FIG. 7(a)), and then cover unit 232 is again closed to complete the processing for wafer W in SPM processing apparatus 2 (see, FIG. 7(b)).

As described above, while a series of operations are being performed, such as preparing of wafer W to be processed, loading and processing of wafer W in SPM processing bath 21 by using the SPM liquid, and unloading of wafer W, the temperature of the SPM liquid in SPM processing bath 21 is maintained in the range of 135□□170□, for instance, 140° C., and hood unit 231 is always communicated with exhaust path 233. As a result, a greater amount of moisture components is preferentially evaporated among the sulfuric acid, the hydrogen peroxide and water constituting the SPM liquid, thereby restraining the lowering of the concentration of the sulfuric acid caused by the water created due to the decomposition of the hydrogen peroxide.

Figure 7:
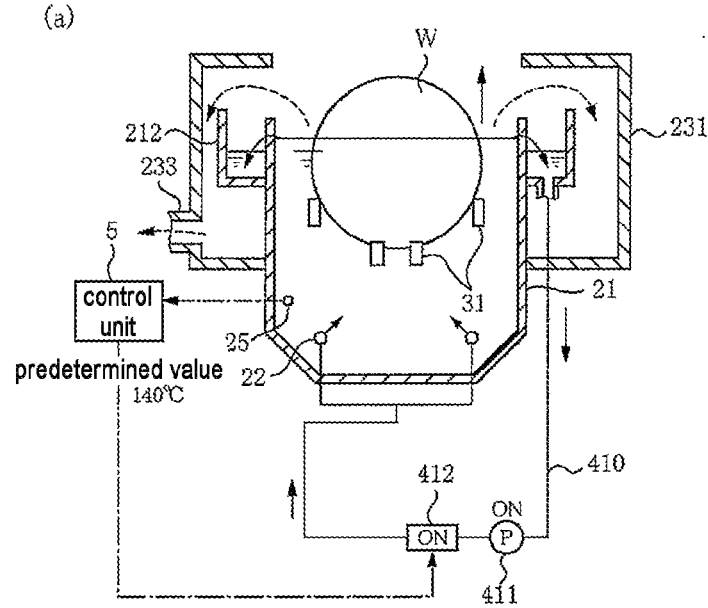
FIGS. 7a and 7b are each a view showing a second operational state of the processing apparatus.
Figure 7:
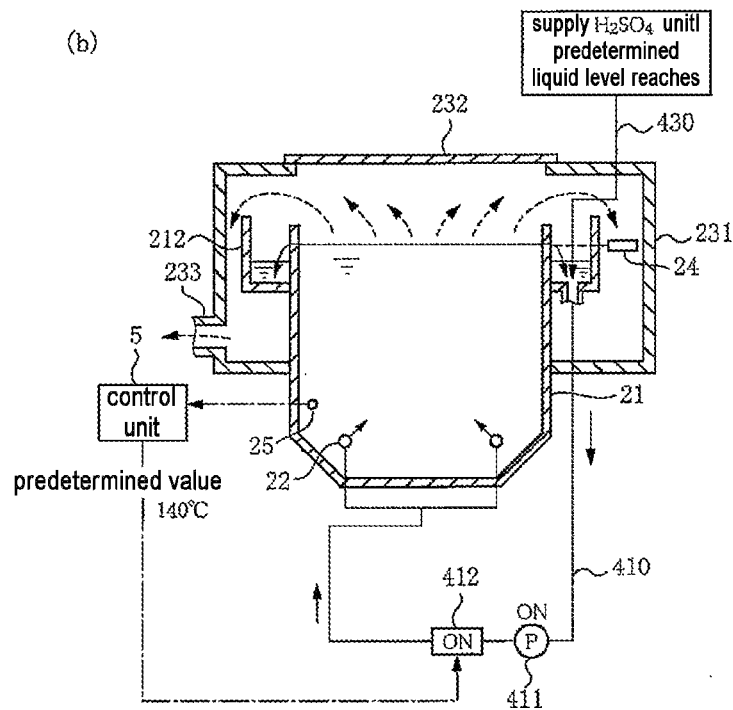

In this manner, according to the present embodiment, the temperature of the SPM liquid is raised higher than the normal temperature in order to actively evaporate moisture components in the SPM liquid. Thus, as shown in FIGS. 6(a) to 7(b), the liquid level of outer tub 212 is gradually lowered. Therefore, as shown in FIG. 7(b), when wafer W has been processed, SPM processing apparatus 2 detects whether the liquid level in outer tub 212 is lower than a predetermined liquid level by using liquid level sensor 24, and supplements the sulfuric acid from sulfuric acid tank 43 until the liquid level in outer tub 212 reaches the predetermined level if the liquid level in outer tub 212 is lower than the predetermined liquid level (see, FIG. 7(b)). That is, the SPM liquid is heated at the high temperature of 135° C. to 170° C., so that the moisture components in the SPM liquid can be evaporated and the sulfuric acid is supplemented to compensate for the evaporated moisture components. Thus, the amount and temperature of the SPM liquid in the circulation system can be adjusted to the predetermined level, and a next wafer W can be readily processed.

After wafer W has been processed by the SPM liquid, wafer W is moved up from SPM processing bath 21 and transferred again to second carrier arm 125 from wafer boat 3. Then, wafer W is rinsed in rinse bath 141 by deionized water (DI), and then transferred to dry processing part 13. In dry processing part 13, wafer W is subjected to the IPA (Isopropyl alcohol) drying process in wafer drying unit 131, and processed wafer W is then loaded onto interface part 12 by second carrier arm 125. Wafer W is then transferred to posture changing device 124.

Contrary to the loading process, posture changing device 124 changes the posture of wafer W from the vertical state to the horizontal state, and transfers wafer W to transfer arm 122. Transfer arm 122 loads wafer W into empty FOUP 6 aligned on transfer table 113. After that, the cover of FOUP 6 is closed and FOUP 6 is loaded on the placement table 111 by first carrier arm 112. Then, FOUP 6 holding wafer W that has been processed is transferred to the next stage by, for example, the carrier robot. The above operations are repeatedly performed in wafer processing system 1 of the present embodiment, so wafer processing system 1 can process, for example, several hundreds of wafers W in one hour.

SPM liquid processing apparatus 2 according to the present embodiment has the following effects. The temperature of the SPM liquid is adjusted in the range of 135° C.~170° C., for example, 140° C.~150° C., which is higher than the normal temperature range, so the moisture components of the mixture of the sulfuric acid, the hydrogen peroxide and water constituting the SPM liquid can be preferentially evaporated. In addition, the sulfuric acid corresponding to the amount of the moisture component decreased by the evaporation is supplemented, thereby restraining the increase of the moisture concentration in the SPM liquid. In addition, since a smaller amount of the hydrogen peroxide is supplemented to the SPM liquid in the vicinity of SPM processing bath 21 according to the process timing, the amount of moisture derived from the decomposition of the supplemented hydrogen peroxide can be reduced. As a result, water is extracted from the SPM liquid, so that the lowering of the concentration of the sulfuric acid caused by water created from the hydrogen peroxide can be restrained, thereby reducing the frequency of the exchange of the entire SPM liquid.

In addition, according to SPM processing apparatus 2 of the present embodiment, 1) hydrogen peroxide supply line 420 is connected to the downstream side of heating unit 412 installed in circulation line 410, 2) the position for supplying the hydrogen peroxide is located in front of the outlet of SPM supply nozzle serving as the circulation path. For instance, the position is preset to enable the SPM liquid to be discharged from discharge holes 221 of SPM nozzle 22 within 5 seconds after the hydrogen peroxide is supplied to the SPM liquid circulating in circulation line 410. Due to the above configuration, even if the temperature of the SPM liquid is raised higher than the normal temperature to preferentially evaporate the moisture components, the decomposition of the components, such as the hydrogen peroxide and Caro's acid derived from the reaction between the sulfuric acid and the hydrogen peroxide, effective for removing contaminant materials can be restrained.

According to SPM processing device 2 of the present embodiment as described above with reference to FIG. 7(b), liquid level sensor 24 detects the liquid level of the SPM liquid in outer tub 212, and the sulfuric acid is supplemented when the liquid level detected by liquid level sensor 24 is lower than the predetermined level. However, the timing for supplying the sulfuric acid is not limited to the above case. For instance, a predetermined amount of the sulfuric acid or the amount of the sulfuric acid capable of compensating for the evaporated moisture can be periodically supplied after processed wafer W has been taken out of processing bath 21 and before a next wafer W is loaded into SPM processing bath 21. In this case, variation of the concentration of the sulfuric acid in the SPM liquid according to the supply of the sulfuric acid can be minimized.

In addition, according to SPM processing apparatus 2 shown in FIG. 5, while SPM processing bath 21 is covered with hood unit 231 and cover unit 232, and vapor contained in hood 231 is forcibly exhausted, hood unit 231 may be omitted. For instance, vapor generated from the SPM liquid in SPM processing bath 21 or outer tub 212 may be naturally exhausted to the space inside wafer processing system 1. In this case, the opening formed in the top surface of SPM processing bath 21 or outer tub 212 may serve as the exhaust part of SPM processing apparatus 2.

In wafer processing system 1 as described above, in combination with the processing by the SPM liquid, a DHF (Diluted Hydrofluoric acid) solution can be employed to remove an oxide film from the surface of wafer W and SC-1 solution (mixture of ammonia and hydrogen peroxide) can be employed to remove particles or organic contaminant materials from the surface of wafer W. Further, SC-2 solution (mixture of hydrochloric acid and hydrogen peroxide) can be employed to remove metallic impurities from the surface of wafer W. Also, other processes can be performed instead in combination with the process by the SPM liquid.

EXPERIMENT

Wafers W have been repeatedly processed by using SPM processing apparatus 2 shown in FIG. 5 in the manner as shown in FIGS. 6(a) to 7(b), and the concentration of the sulfuric acid and moisture in the SPM liquid (initial concentration: 95 weight % of sulfuric acid and 5 weight % of hydrogen peroxide) depending upon a time has been measured while varying the temperature of the SPM liquid. Fifty wafers W have been processed as one lot in each experiment. In this experiment, the exchange timing of the entire SPM liquid has been set at a time point where the concentration of the sulfuric acid reaches 80 weight %.

A. Experimental Conditions

Embodiment

Temperature of SPM liquid: 140° C.;
Supply of hydrogen peroxide: 150 ml of hydrogen peroxide is supplied for 3 seconds before every wafer processing is initiated;
Supply of sulfuric acid: 150 ml of sulfuric acid is supplied after every wafer processing is initiated;
Flow rate of SPM liquid in circulation line 410: 40 l/min Comparative Example Temperature of SPM liquid: 120° C.;
Supply of hydrogen peroxide: 150 ml of hydrogen peroxide is supplied for 3 seconds before every wafer processing is initiated;
Supply of sulfuric acid: liquid level is controlled by liquid level sensor 24. Sulfuric acid is supplied until the liquid level in outer tub 212 reaches a predetermined level if the liquid level in outer tub 212 is lower than the predetermined level after wafer W has been processed;
Flow rate of SPM liquid in circulation line 410: 40 l/min.

Experimental Result

Figure 8:
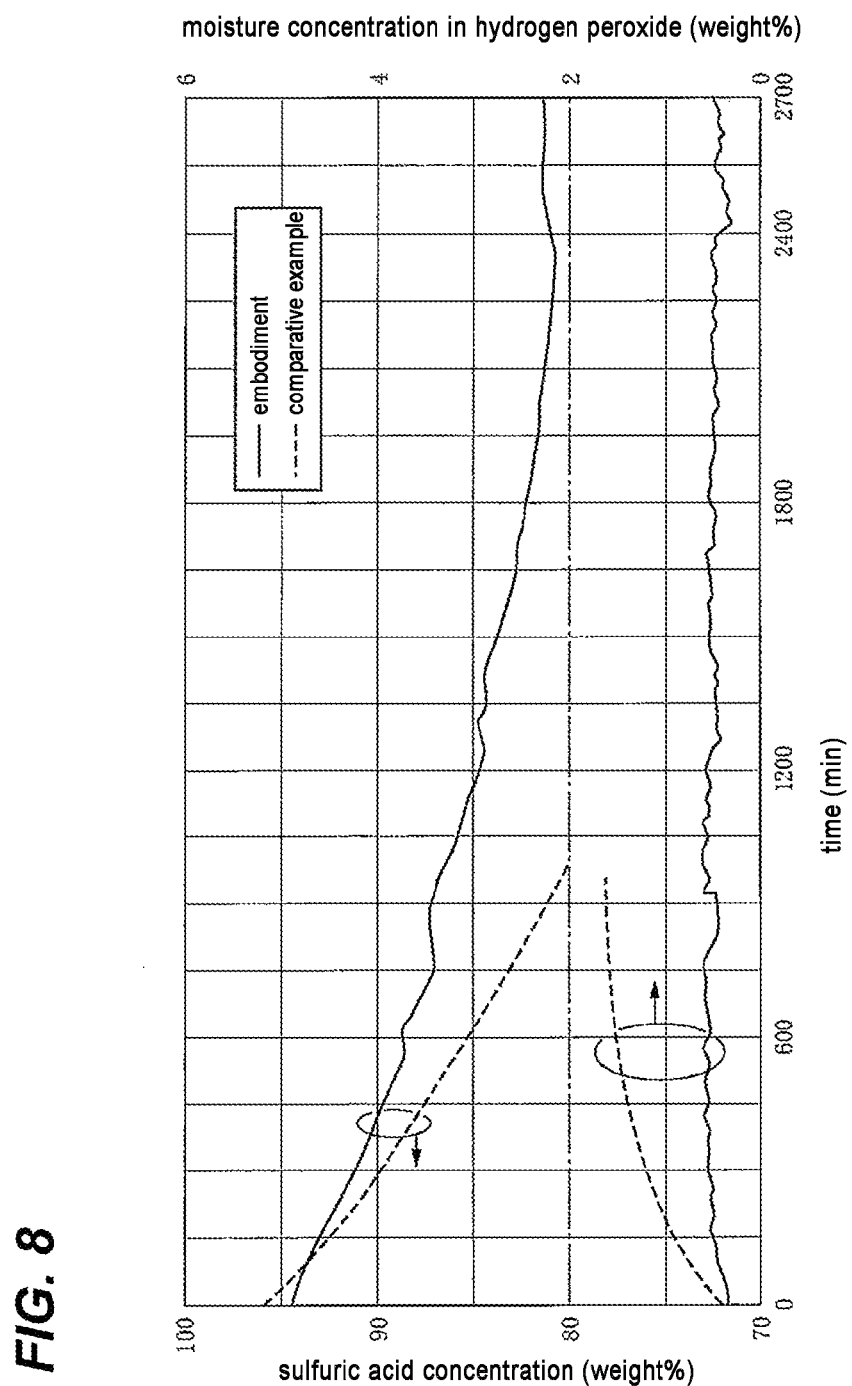
FIG. 8 is a graph to explain the function of the processing apparatus according to the embodiment of the present disclosure.

FIG. 8 shows the graph illustrating variation of the concentration of the sulfuric acid and the hydrogen peroxide in the embodiment and the comparative example. In FIG. 8, an X-axis represents time(min), a left-side Y-axis represents sulfuric acid concentration (weight %), and a right-side Y-axis represents moisture concentration (weight %) included in the hydrogen peroxide. In FIG. 8, the solid line represents the embodiment and the dotted line represents the comparative example. In addition, although the actual concentration is slightly changed due to the supply of the hydrogen peroxide or the sulfuric acid, FIG. 8 shows the smooth result of the concentration.

According to the result shown in FIG. 8, the concentration of the sulfuric acid is lowered as the time has elapsed due to the supplement of the hydrogen peroxide, but the gradient of the graph (i.e., the speed of lowering) is gradually flattened. In addition, after 2400 minutes, the concentration of the sulfuric acid is almost constantly maintained higher than 80 weight % by about 1 to 2 weight %, in which 80 weight % represents the timing for exchanging the entire SPM liquid. In addition, in the period of 2700 minutes, 160 lots of wafers W have been processed. Meanwhile, although the concentration of water in the hydrogen peroxide slightly varies during the experiment, the concentration of water is maintained at 0.5 weight %, and the increase of moisture concentration has not been observed.

That is, since the temperature of the SPM liquid is adjusted to 140° C., the dilution of the sulfuric acid caused by the supply of the hydrogen peroxide and the condensation of the sulfuric acid caused by the evaporation of the moisture may be simultaneously occurred in parallel in the SPM liquid. As a result, the dilution rate of the sulfuric acid is accelerated when the concentration of the sulfuric acid is lowered. Meanwhile, in the period where the concentration of the sulfuric acid is constant, the dilution rate and condensation rate of the sulfuric acid caused by the evaporation of the moisture may be balanced. Since the concentration of the sulfuric acid has been maintained at 80% or above in the SPM liquid, wafer W can be processed without causing any problem.

In addition, according to the result of the comparative example indicated by the dotted line, the concentration of the sulfuric acid in the SPM liquid is constantly lowered as time has elapsed and reaches 80 weight % at the period of 980 minutes after the process initiation, signifying that the entire sulfuric acid is needed to be exchanged. At this time, the moisture concentration in the hydrogen peroxide is increased by three times from 0.5 weight % to 1.5 weight % indicating that the evaporation rate of the moisture is insufficient and the moisture is accumulated in the SPM liquid.

As can be confirmed from the above result, if the temperature of the SPM liquid in SPM liquid processing bath 21 is adjusted in the range of 135° C.~170° C., for instance, 140° C., the amount of the hydrogen peroxide to be supplied can be reduced and the lowering of the concentration of the sulfuric acid can be restrained as compared with the case in which the temperature of the SPM liquid is adjusted to 120° C.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a processing bath to process a substrate by immersing the substrate in SPM liquid (sulfuric acid and hydrogen peroxide mixture);
   a circulation path to circulate the SPM liquid in the processing bath;
   a heating unit provided in the circulation path to heat the SPM liquid;
   a sulfuric acid supply unit to supplement sulfuric acid to the SPM liquid;
   a hydrogen peroxide supply unit including an opening/closing valve provided at a downstream side of the heating unit in the circulation path in front of an outlet of the circulation path configured to selectively supplement hydrogen peroxide to the SPM liquid while the SPM liquid is circulating in the circulation path such that the SPM liquid is supplied to the processing bath in a state where the hydrogen peroxide supplied from the hydrogen peroxide supply unit and Caro's acid generated by a reaction between the hydrogen peroxide and the sulfuric acid are prevented from being directly heated by the heating unit, and decomposition of the hydrogen peroxide and Caro's acid is restrained;
   a temperature detection unit to detect a temperature of the SPM liquid in the processing bath; and
   a control unit that is programmed to control an overall operation of the substrate processing apparatus, the programming comprising: adjusting an output of the heating unit based on the temperature detected by the temperature detection unit such that the temperature of the SPM liquid in the processing bath is maintained in a predetermined range of 135° C. to 170° C., supplementing the SPM liquid by the hydrogen peroxide through the hydrogen peroxide supply unit such that the SPM liquid supplemented by the hydrogen peroxide is supplied to the processing bath after the substrate is immersed in the SPM liquid in the processing bath, and supplementing the sulfuric acid from the sulfuric acid supply unit to compensate for the SPM liquid as the SPM liquid is evaporated by heating.

2. The substrate processing apparatus of claim 1, wherein a flow rate of the SPM liquid in the circulation path is in a range of 20 l/min to 50 l/min.

3. The substrate processing apparatus of claim 1, wherein the substrate is processed by repeatedly immersing a new substrate in the SPM liquid of the processing bath and taking the substrate out of the processing bath, and
   the control unit is further programmed to control the sulfuric acid supplement unit to periodically supplement the sulfuric acid after a processed substrate has been taken out of the processing bath and before a next substrate is immersed in the SPM liquid.

4. The substrate processing apparatus of claim 1, further comprising:
   an outer tub provided at an upstream side of the circulation path to receive the SPM liquid overflowing from the processing bath; and
   a liquid level detection unit to detect a liquid level of the SPM liquid in the outer tub, wherein the control unit is further programmed to control the sulfuric acid supplement unit to supplement the sulfuric acid into the SPM liquid when the liquid level of the SPM liquid detected by the liquid level detection unit is lower than a predetermined level.

5. The substrate processing apparatus of claim 1, wherein a supplement position of the hydrogen peroxide in the circulation path is preset in such a manner that the SPM liquid circulating in the circulation path supplemented with the hydrogen peroxide is able to be introduced from the supplement position into the processing bath within 5 seconds.

6. The substrate processing apparatus of claim 1, wherein a supplement position of the hydrogen peroxide in the circulation path is preset within 50 cm from the outlet of the circulation path in an upstream direction.

7. A method of processing a substrate comprising:
   processing a substrate by immersing the substrate in SPM liquid (sulfuric acid and hydrogen peroxide mixture) filled in a processing bath;
   circulating the SPM liquid in the processing bath through a circulation path;
   adjusting a temperature of the SPM liquid filled in the processing bath to a predetermined temperature in a range of 135° C. to 170° C. by heating the SPM liquid in the circulation path;
   supplementing sulfuric acid to the SPM liquid to compensate for the SPM liquid as the SPM liquid is evaporated by heating; and
   supplementing hydrogen peroxide to the SPM liquid at a downstream side of a heating position for the SPM liquid in the circulation path in front of an outlet of the circulation path.

8. The method of claim 7, wherein a flow rate of the SPM liquid in the circulation path is in a range of 20 l/min to 50 l/min.

9. The method of claim 7, wherein immersing a substrate in the SPM liquid of the processing bath and taking the substrate out of the processing bath are repeatedly performed, and
   the sulfuric acid is periodically supplemented after a processed substrate has been taken out of the processing bath and before a next substrate is immersed in the SPM liquid.

10. The method of claim 7, further comprising:
    receiving the SPM liquid overflowing the processing bath using an outer tub and allowing the SPM liquid to flow through the circulation path; and
    detecting a liquid level of the SPM liquid in the outer tub, wherein the sulfuric acid is supplemented into the SPM liquid when the detected liquid level of the SPM liquid is lower than a predetermined level.

11. The method of claim 7, wherein a supplement position of the hydrogen peroxide in the circulation path is preset in such a manner that the SPM liquid is able to be introduced from the supplement position into the processing bath within 5 seconds.

12. The method of claim 7, wherein the supplement position of the hydrogen peroxide in the circulation path is preset within 50 cm from the outlet of the circulation path in an upstream direction.

13. A storage medium having a computer program used in a substrate processing apparatus for processing a substrate by immersing the substrate in SPM liquid (sulfuric acid and hydrogen peroxide mixture), wherein the computer program comprises commands for executing the method for processing the substrate claimed in claim 7.

* * * * *